(12) United States Patent
Hurwitz et al.

(10) Patent No.: US 9,911,700 B2
(45) Date of Patent: Mar. 6, 2018

(54) EMBEDDED PACKAGES

(71) Applicant: Zhuhai Advanced Chip Carriers & Electronic Substrate Solutions Technologies Co. Ltd., Zhuhai (CN)

(72) Inventors: Dror Hurwitz, Zhuhai (CN); Alex Huang, Zhuhai (CN)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 0 days.

(21) Appl. No.: 15/006,805

(22) Filed: Jan. 26, 2016

(65) Prior Publication Data

US 2017/0213793 A1 Jul. 27, 2017

(51) Int. Cl.
- H01L 23/34 (2006.01)
- H01L 23/538 (2006.01)
- H01L 23/373 (2006.01)
- H01L 23/498 (2006.01)
- H01L 23/532 (2006.01)

(52) U.S. Cl.
CPC ...... H01L 23/5389 (2013.01); H01L 23/3736 (2013.01); H01L 23/49827 (2013.01); H01L 23/49838 (2013.01); H01L 23/53238 (2013.01); H01L 2224/18 (2013.01)

(58) Field of Classification Search
CPC ... H01L 23/481; H01L 23/5389; H01L 24/19; H01L 2224/49171; H01L 2924/181; H01L 2224/81; H01L 21/56; H01L 2224/04105; H01L 23/3114; H01L 24/05; H01L 24/82; H01L 2023/4037; H01L 2023/4043; H01L 2023/405

See application file for complete search history.

(56) References Cited

U.S. PATENT DOCUMENTS

| | | | |
|---|---|---|---|
| 2008/0080112 A1* | 4/2008 | Lin | H01L 21/76816 361/56 |
| 2009/0315170 A1* | 12/2009 | Shim, II | H01L 21/6835 257/692 |
| 2012/0187582 A1* | 7/2012 | Chen | B29C 45/14639 257/787 |
| 2013/0200517 A1* | 8/2013 | Wu | H01L 23/3121 257/741 |
| 2014/0077394 A1* | 3/2014 | Chang | H01L 23/4334 257/782 |
| 2014/0131858 A1* | 5/2014 | Pan | H01L 24/13 257/737 |
| 2015/0108661 A1* | 4/2015 | Vincent | H01L 24/30 257/777 |

* cited by examiner

*Primary Examiner* — Khiem D Nguyen
(74) *Attorney, Agent, or Firm* — Wiggin and Dana LLP; Gregory S. Rosenblatt; Andrew D. Bochner

(57) ABSTRACT

A structure consisting of at least one die embedded in a polymer matrix and surrounded by the matrix, and further consisting of at least one through via through the polymer matrix around perimeter of the die, wherein typically the at least one via has both ends exposed and where the die is surrounded by a frame of a first polymer matrix and the at least one through via passes through the frame; the die is positioned with terminals on a lower surface such that the lower surface of the chip is coplanar with a lower surface of the frame, the frame is thicker than the chip, and metal is directly attached to and covers at least part of the upper surface of the chip.

34 Claims, 15 Drawing Sheets

EMBEDDED PACKAGES

BACKGROUND

Field of the Disclosure

The present invention is directed to chip packaging, specifically to embedded chips.

Description of the Related Art

Embedding chips within the interposers to the outside world enables shrinking the chip package, shortening the connections to the outside world, offers cost savings by simpler manufacturing that eliminates die to substrate assembly processes and potentially has increased reliability.

Essentially, the concept of embedding active components such as analog, digital and MEMS chips involves the construction of chip support structures or substrates, having vias around the chip.

One way of achieving embedded chips is to fabricate chip support structures onto the chip array on the wafer where the circuitry of the support structure is larger than the die unit size. This is known as Fan Out Wafer Layer Packaging (FOWLP). Although the size of silicon wafers is growing, expensive material sets and manufacturing process are still limiting the diameter size to 12", thereby limiting the number of FOWLP units one can place on the wafer. Despite the fact that 18" wafers are under consideration, the investment required, materials sets and equipment are still unknown. The limited number of chip support structures that may be processed at one time increases the unit cost of FOWLP, and make it too expensive for markets requiring highly competitive pricing, such as wireless communication, home appliances and automotive markets.

FOWLP also represents a performance limitation since the metal features placed over the silicon wafer as fan-out or fan-in circuitry are limited in thickness to a few microns. This creates electrical resistance challenges.

An alternative fabrication route involves sectioning the wafer to separate the chips and embedding the chips within a panel consisting of dielectric layers with copper interconnects. One advantage of this alternative route is that the panels may be very much larger with very many more chips embedded in a single process. For example, whereas for example, a 12" wafer enables 2,500 FOWLP chips having dimensions of 5 mm×5 mm to be processed in one go, current panels used the applicant, Zhuhai Access, are 25"×21", enabling 10,000 chips to be processed in one go. Since the price of processing such panels is significantly cheaper than on wafer processing, and since the throughput per panel is 4× higher than throughput on wafer, the unit cost can drop significantly, thereby opening new markets.

In both technologies, the line spacing and the width of the tracks used in industry are shrinking over time, with 15 micron going down to 10 microns being standard on panels and 5 microns going down to 2 microns on wafers.

The advantages of embedding are many. First level assembly costs, such as wire bonding, flip chip or SMD (Surface Mount Devices) soldering, are eliminated. The electrical performance is improved since the die and substrate are seamlessly connected within a single product. The packaged dies are thinner, giving an improved form factor, and the upper surface of the embedded die package is freed up for other uses including stacked die and PoP (Package on Package) technologies.

In both FOWLP and Panel based embedded die technologies, the chips are packaged as an array (on wafer or panel), and, once fabricated, are separated by dicing. Yang (US 2008/0157336) discloses an on-wafer packaging method. A grid with conductive vias is placed onto and bonded with a wafer with chips thereupon. The wafer is subsequently diced.

The methodology of Yang has a problem in that differences in coefficient of thermal expansion (CTE) between silicon, metals and polymers results in a need for a dielectric layer under the re-distribution layer (RDL) and also a protective layer thereover. This increases costs and requires the creation of a via in the dielectric layer under the redistribution layer to allow metal contact between the Die pads and the RDL, complicating and reducing yields of the manufacturing process due to the need for precise alignment between the via and the die pad.

Fabricating the vias required by Yang requires complex laser drilling or photolithography to expose the extra dielectric layer over the die. This requires an alignment step that reduces yield, increases unit cost and limits the range of dies that may be packaged in this manner. It will be appreciated that as the die pad contacts become smaller the dielectric via needs to be scaled down accordingly to allow alignment without the via failing. Furthermore, Yang's extra dielectric layer covers both the die terminals and the PCB connection terminals requiring that this dielectric layer conform to z-axis topographies that are different in scale. For example, in the PCB frame the dielectric layer is typically required to cover Cu pad terminals that are 10 to 20 microns diameter, while the terminals of the die itself which also need to be covered are typically an order of magnitude smaller and are only 1 to 2 microns thick. Since the dielectric layer needs to be at least 10 microns above the PCB pad terminals to cover their topography, it will be 20 microns above the smaller Die terminals. To create vias having diameters that are less than 50 microns in diameter in a dielectric layer that is 10 to 20 micron thick is technologically challenging. Reliability requirements would force the die terminals to remain larger than 50 um+10 um (for best alignment) requiring 60 micron diameter die pads. Since both die geometries and the size of their terminals are ever shrinking, the limitation of the structure proposed by Yang is clear.

Thus in many cases, the via size in the extra dielectric layer will have a minimal diameter due to process concerns, thereby limiting the application of this structure to wide range of dies.

Yang (US 2008/0157336) Yang discloses a package structure having a substrate with a die receiving through hole, a connecting through hole structure and a first contact pad; a die disposed within the die receiving through hole; a surrounding material formed under the die and filled in the gap between the die and side wall of the die receiving though hole; a dielectric layer formed on the die and the substrate; a redistribution layer (RDL) formed on the dielectric layer and coupled to the first contact pad; a protection layer formed over the RDL; and a second contact pad formed at the lower surface of the substrate and under the connecting through hole structure.

Pending Patent Publication No. US 2015/279,814 to the present applicant, titled "embedded chips" describes a structure comprising at least one die positioned in a through hole within a frame of a first polymer matrix, the die being embedded in a second polymer matrix and surrounded by matrix, wherein the die is positioned with its terminals on a lower surface such that said lower surface of said die is coplanar with a lower surface of the frame, The frame is thicker than the die, and wherein the die is surrounded on all but lower face with a packaging material a comprising the second polymer matrix, wherein a first feature layer of conductor pads is deposited onto the coplanar lower surfaces of the die and frame. Despite the advantages of the embedded chips described in US 2015/279,814, such chips have poor heat dissipation since the upper side of the die that is opposite to the side with terminals is covered with the packaging material which has poor heat conductivity.

BRIEF SUMMARY

An aspect of the invention is directed to an Embedded chip-package for coupling a die to a PCB or device, the chip package comprising a die having a terminal face and a back face separated by a die height, the die surrounded by a frame comprising a first polymer matrix, the frame having a frame height extending between a first frame face and a second frame face that is at least 3 micron meters thicker than the die height, wherein the gap between the die and frame is filled with a packaging material comprising a second polymer matrix having a height equals to the die height, wherein the die terminal face and the packaging material are coplanar with the first frame face, the embedded chip package further comprising a first metal layer that is at least 1 micron thick and that is directly attached to the die, packaging material and first frame surface, and wherein a second metal layer is directly attached to the die back face, second frame face and packaging and extends in a layer that is at least 1 micron thick over the frame surface and at least 4 micron meters thick over the die and packaging material surfaces.

Preferably the outer surface of the said first metal layer is flat and serves as a re-distribution layer comprising elements having one end on a die terminal and a second end on the frame face area in a fan-out or fan in configuration.

Preferably, an outer surface of the said second metal layer is flat and at least a portion of the second metal layer attached to and over the die serves as a heat-sink to aid heat dissipation from the back-face of the die.

Typically the second end of the element in the redistribution layer is selected from the group comprising BGA pads, LGA pads, wire-bond pads, flip-chip pads used to attach the embedded chip package to a PCB or a device.

Typically an outer surface of the second metal layer is flat, the second metal layer comprising at least two electrically separate nets, each net comprising elements having two ends, one end on the die area and the second end on the frame area in a fan-out configuration or with as second end on the die area fan in configuration.

Optionally, at least one of the ends of the elements is a BGA pad, LGA pad, wire-bond pad or flip-chip pad for attaching the said embedded chip package to a PCB or a device.

Typically, the first metal layer is less than 50 microns thick and the second metal layer is less than 200 microns thick.

Typically, the height of said frame is up to 500 microns meters thick and is up to 50 micron meters thicker than the thickness of the die.

In some embodiments, the first polymer matrix and the second polymer matrix comprise different polymers.

In some embodiments the first polymer matrix has a slower dry etch rate than the second polymer matrix under same dry etching conditions.

In some embodiments the frame further comprises at least one of ceramic particulate fillers and woven glass fibers.

Optionally the frame further comprises at least one metal via extending the height of the frame from the first frame face to the second frame face of the frame.

Optionally, the packaging material further comprises at least one of ceramic particulate fillers and chopped glass fibers.

In some embodiments, the die terminal face contains metal terminal contacts surrounded by a dielectric passivation layer where said metal terminal contacts and said dielectric passivation layer are coplanar with the first frame face and a face of the intervening packaging material.

Optionally, the metal terminal contacts comprise a metal selected from the group comprising Al, Cu, Au, W and the passivation layer is selected from the group comprising polyimides and silicon nitride.

Optionally the first metal feature layer is connected to a surface of at least one via on said first frame face, said via running through the frame to the second frame face.

Optionally at least some of the metal layer attached directly to the die back surface functions as a metal interconnect feature layer in a fan out configuration that couples the die back surface to the frame face.

Optionally, the said at least one metal feature layer is coupled to at least one via running through the frame from the second frame face to the first frame face.

In some embodiments, the die comprises at least one metal pad on its back face and further comprises at least one Through Silicon Via (TSV) electrically connecting the metal pad to at least one contact on the terminal face.

Optionally, the metal via comprises copper.

Typically the first and second metal layer comprise copper.

Typically the first and second metal layer further comprise adhesion/barrier metal layers sandwiched between the said copper and the said die frame and packaging material surfaces, the adhesion/barrier layer selected from the group comprising Ti, Ta, Cr, Ti/Ta and Ti/W.

Typically the die comprises at least one component selected from the group comprising analog integrated circuits, digital integrated circuits, filters, switches, flash memories, MEMS chips, sensors and Integrated Passive Devices.

In some embodiments, the embedded chip package comprises a plurality of dies within the same frame, the dies separated by the polymer packaging material.

In some embodiments, the embedded chip package comprises a plurality of dies separated by the polymer packaging material and by a bar of the dielectric frame.

In some embodiments, the embedded chip package comprises additional redistribution layers parallel to the first metal layer on an opposite sides thereof from the die, and separated therefrom by polymer dielectric material and interconnected therewith by vias.

In some embodiments, a second end of an element in an outermost redistribution layer is selected from the group comprising BGA pads, LGA pads, wire-bond pads and flip-chip pads and is used to attach the embedded chip package to a PCB or a device.

In some embodiments, the embedded chip package comprises at least one further metal layer parallel to the die back surface and beyond the second metal layer, and separated from said second metal layer by a polymer dielectric material but interconnected to said second metal layer by at least one metallic via through the polymer dielectric material. 29. The embedded chip package of claim 28 where one end of an element in the external layer is selected from the group comprising a BGA pad, LGA pad, wire-bond pad, and flip-chip pad and is used to attach the embedded chip package to a PCB a device.

In some embodiments, the embedded chip package comprises at least one further metal layer parallel to the die back surface and beyond the second metal layer, and separated from said second metal layer by a polymer dielectric material but interconnected to said second metal layer by at least one metallic via through the polymer dielectric material.

In some embodiments, the device is a die, IC package, inductor, resistor, capacitor or integrated passive device.

The term micron used herein means micrometer and refers to dimensions measured in units of $1\times10^{-6}$ m.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings:

FIGS. 11(*a*) to 11(*aa*) schematically show the intermediate structures obtained by the process of FIG. 11.

DETAILED DESCRIPTION

The present invention is directed to embedded chip packages characterized by having metal, typically copper deposited directly onto both the front and the back face of the chip.

The metal deposited directly on the termination side is coupled to the terminations and generally provides a fan out arrangement for coupling the embedded chip to a printed circuit board or the like. The copper on the far side from the termination side typically serves as a heat sink and enables more effective heat dissipation that the polymeric filler that covers the far side of the chip in packaging solutions such as Pending Patent Publication No. US 2015/0279814 A1 titled "Embedded Chips". This makes the packaging solution disclosed herein appropriate for fast switching chips.

Where there are through chip vias, the copper on the back side of the chip may provide an electrical connection.

Furthermore, theoretically the technology discussed herein could be used for embedding a double sided chip, having circuitry and terminations on both sides of a wafer.

Figure 1:
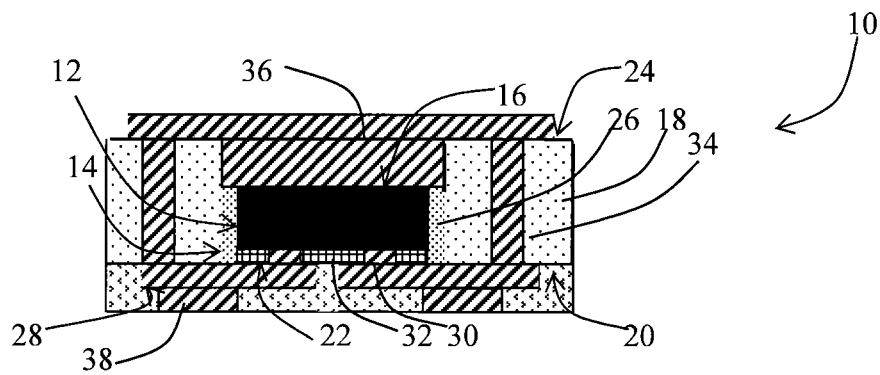
FIG. 1 is a schematic side view of a first embedded chip structure.

With reference to FIG. 1, an embedded chip package 10 is shown. The embedded chip package 10 includes a die 12 having a terminal face 14 and a back face 16 separated by the height of the die 10. The die 12 is surrounded by a frame 18 having a first frame face 20 that is coplanar with one face 22 of the die 12, which, in this instance, is the terminal face 14. The frame 18 is thicker than the height of the die 12, typically by 15 microns to 50 microns, so that the second frame face 24 is higher than the back face 16 of the die 12. The space between the die 12 and the surrounding frame 18 is filled with a packaging material 26; the bottom surface of the packaging material is coplanar with the terminal face 14 of the die 12 and with the first frame face 20. A feature layer 28 is directly attached to the terminal face 14 and elements thereof fan out from the terminal contacts 30 of the terminal face 14 and extend over at least part of the first frame face 20.

The terminal face 14 of the die 12 contains metal terminal contacts 30 surrounded by a dielectric passivation layer 32. The metal terminal contacts and the dielectric passivation layer are coplanar with the first frame face 20 and a face of the intervening packaging material. One or more conductive vias 34, typically copper, may be provided through the thickness of the frame 18. These vias 34 connect the first frame face 20 and the second frame face 24.

The feature layer 28 deposited directly onto the die and surrounding coplanar dielectric may extend to the one or more vias 34.

Unlike many embedded chip packages, in the embedded chip package 10 described herein, the dielectric packaging material 26 does not cover the back face 16 of the die 12. Instead, a copper layer 36 is provided that is directly attached to and at least partially covers the back face 16 of the die. Copper may fill the recess between the back face 16 of the die 12 and the second frame face 24.

The frame 18 has a first polymer matrix and the packaging material 26 has a second polymer matrix. The first polymer matrix of the frame 18 may be different from the second polymer matrix of the packaging material 26, by having different molecular weight and/or different molecular groups.

Preferably the first polymer matrix has a slower dry etch rate than the second polymer matrix under same dry etching conditions. Consequently, where, during manufacture, the packaging material 26 is applied over the back face 16, and the recess is filled with packaging material that may also cover the second frame face 24, thinning, by chemical mechanical polishing CMP for example, may be used to expose the second frame face 24, and dry etching may be used to remove the packaging material 26 covering the back face 16.

In addition to the first polymer matrix, the frame 18 may include glass fibers and ceramic fillers. In some embodiments, the frame 18 is fabricated from pre-pregs of woven glass fibers impregnated with polymer.

The packaging material 26 is mostly a second polymer matrix, but may further include fillers such as ceramic particulate fillers and/or chopped glass fibers, for example.

The metal deposited over the back of the chip may be thinned down and planarized.

It will also be appreciated that processing on both sides of the frame may be carried out simultaneously. It will also be appreciated that once there is a routing layer of conductor features 28 or 36 on one or both sides of the substrate, it is possible to attach further dies to the conductor features 28, 36 with ball grid array (BGA) or land grid array (LGA) technologies, for example.

Furthermore, it is possible to build up further routing layers. In the construction described, there is a single routing layer of conductor pads or features 28, 36 on each side of the chip. Each routing layer may comprise elements that form two distinct electrical nets. Further layers may be built up on either or both sides, enabling package on package "PoP" and similar constructions.

With reference to FIG. 1, an embedded chip package 10 is shown having 1.5 copper layers, i.e. a fan out lower metal layer that is a copper feature layer 28 directly attached to the chip terminals followed by copper posts 38 for mounting, attached below a die, and coupled to the terminals 30 on the first face 14 of the die 12. A heavy upper metal layer that is a copper layer 36 that is at least 4 microns thick is directly attached to and covers the opposite face 16 of the die 12.

Figure 2:
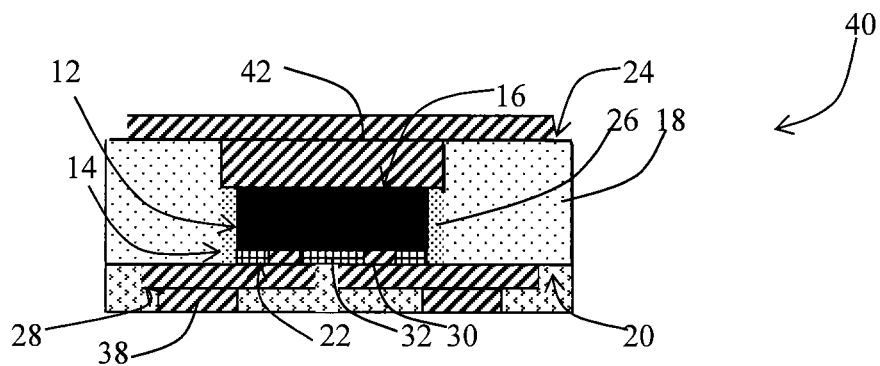
FIG. 2 is a schematic side view of a second embedded chip structure.

With reference to FIG. 2, a second embedded chip package 40 is shown having 1.5 copper layers, i.e. a fan out copper feature layer 28 directly attached to the die 12 followed by copper posts 38 for mounting. The fan out copper feature layer 28 is attached below the die 12 and coupled to the terminals 30 on the first face 14 of the die 12. An upper metal layer which in this case is a copper layer 42 that is at least 4 microns thick and typically 15 to 50 microns thick again covers the opposite side of the die. However, in the second embedded chip package 40 of FIG. 2, there are no vias through the frame, so the heavy copper layer 42 is isolated from the contacts of the die 30 and serves purely as a heat sink. A further heat sink may be adhered thereto with a conductive adhesive.

Figure 3:
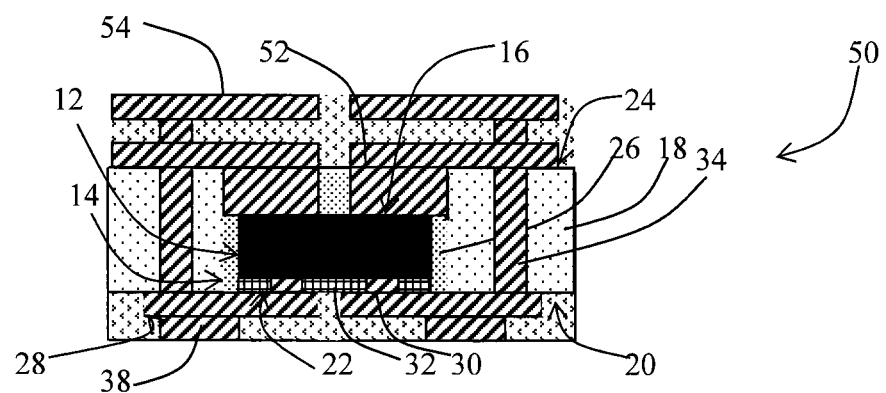
FIG. 3 is a schematic side view of a third embedded chip structure.

With reference to FIG. 3, a third embedded chip package 50 is shown wherein vias 34 through the frame 18 enable electrical contacts from the back side 16 as well as from the front side 14 and the upper metal layer is a copper feature layer 52 on the back side of the die 16 that not only allows connectivity but also allows heat dissipation. The feature layer on the back side 52 can be fan-out or Fan-in and one or more additional feature layers 54 may be provided over the back side 16 of the die 12 to the top surface of the package 50.

Common to the structures shown in FIGS. 1 to 3, is that both sides of the die 12 may be interconnected. The frame 18 may be thinned to the thickness of the die 12 or may remain thicker, however the packaging material 26 is plasma etched to exposing the upper surface of the die 12 which may be the connection face 14 or the back face 16 depending on whether the die is processed terminal side downwards (flip chip orientation) or terminal side upwards.

Since a seed layer may be sputtered on the back face 16 of the die, further metal vias and features may be built up on both sides, and most typically from copper. If the frame 18 includes embedded via posts 34, the layers on each side of the die 12 may be coupled together.

Although currently not available, it will be appreciated that the packaging technique discussed herein could be used for packaging chips with circuitry on both sides. This enables a wafer to be processed on both sides, with, say, a processor chip on one side and a memory chip on the other. The packaging technique described herein could be used to package such a chip and to enable fan out copper features to be applied to both sides of the chip and to selectively couple together the circuits on both faces.

It is a feature of Access' photo-resist and pattern or panel plating and laminating technology, as described in U.S. Pat. Nos. 7,682,972, 7,669,320 and 7,635,641 to Hurwitz et al., incorporated herein by reference, that large panels comprising very large arrays of substrates with very many via posts may be fabricated. Such panels are substantially flat and substantially smooth.

It is a further feature of Access' technology that vias fabricated by electroplating using photoresist, may be narrower than vias created by drill & fill. At present, the narrowest drill & fill vias are about 60 microns. By electroplating using photoresist, a resolution of fewer than 50 microns, or even as little as 30 microns is achievable. Coupling ICs to such substrates is challenging. One approach for flip chip coupling is to provide copper pads that are flush with the surface of the dielectric. Such an approach is described in U.S. Ser. No. 13/912,652 to the present inventors.

All methods for attaching chips to interposers are costly. Wire bonding and flip chip technologies are costly and broken connections result in failure.

Figure 4:
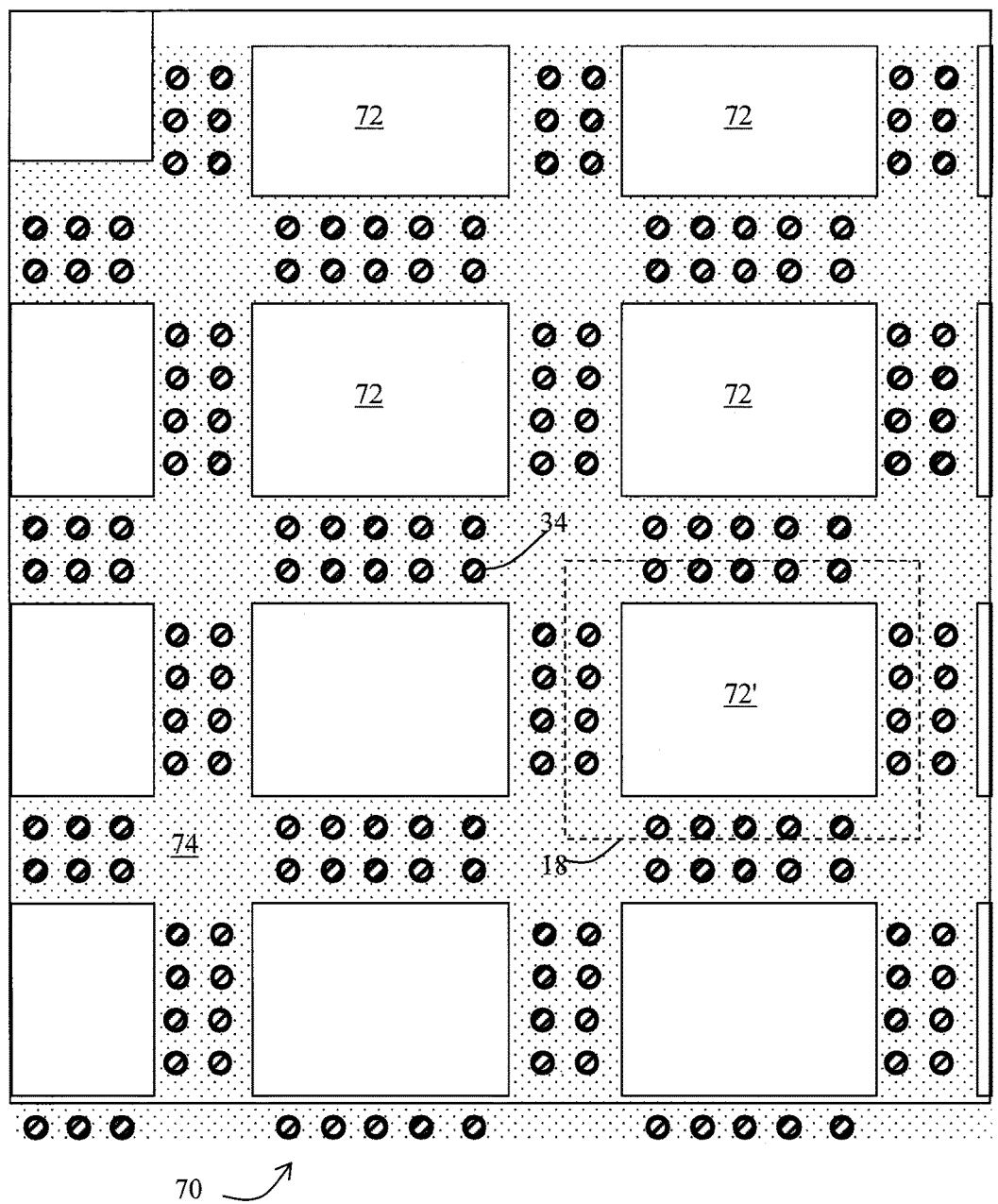
FIG. 4 is schematic illustration of a part of a polymer or composite grid having through sockets therein for dies, and also having through vias around the sockets.

With reference to FIG. 4, there is shown part of an array 70 of die sockets 72 each surrounded by a frame 18 thereby providing a framework 74 comprising a polymer matrix and an array of metal vias 34 through the polymer matrix framework 74. The chip sockets 72 are through sockets; meaning that the framework 74 is an open framework, with the die sockets 72 passing through the thickness of the framework 74, with apertures on both sides of the framework 74.

The metal vias 34 are a convenient addition enabling conductive coupling from either side of the framework 74, but this is not required in all embodiments and is thus not an essential feature.

The array 70 may be part of a panel comprising an array of chip sockets 72, each surrounded and defined by a polymer matrix framework 74 comprising a grid of copper vias 34 through the polymer matrix framework 74.

Each chip socket 72 is thus a through hole surrounded by a frame 18 of polymer, optionally reinforced with ceramic fillers and/or glass fibers, and optionally with a number of copper through vias 34 through the frame 18, arranged around the socket 72'.

The framework 74 may be fabricated from a polymer applied as a polymer sheet, or may be a glass fiber reinforced polymer, applied as a pre-preg. It may have one or more layers.

Figure 5:
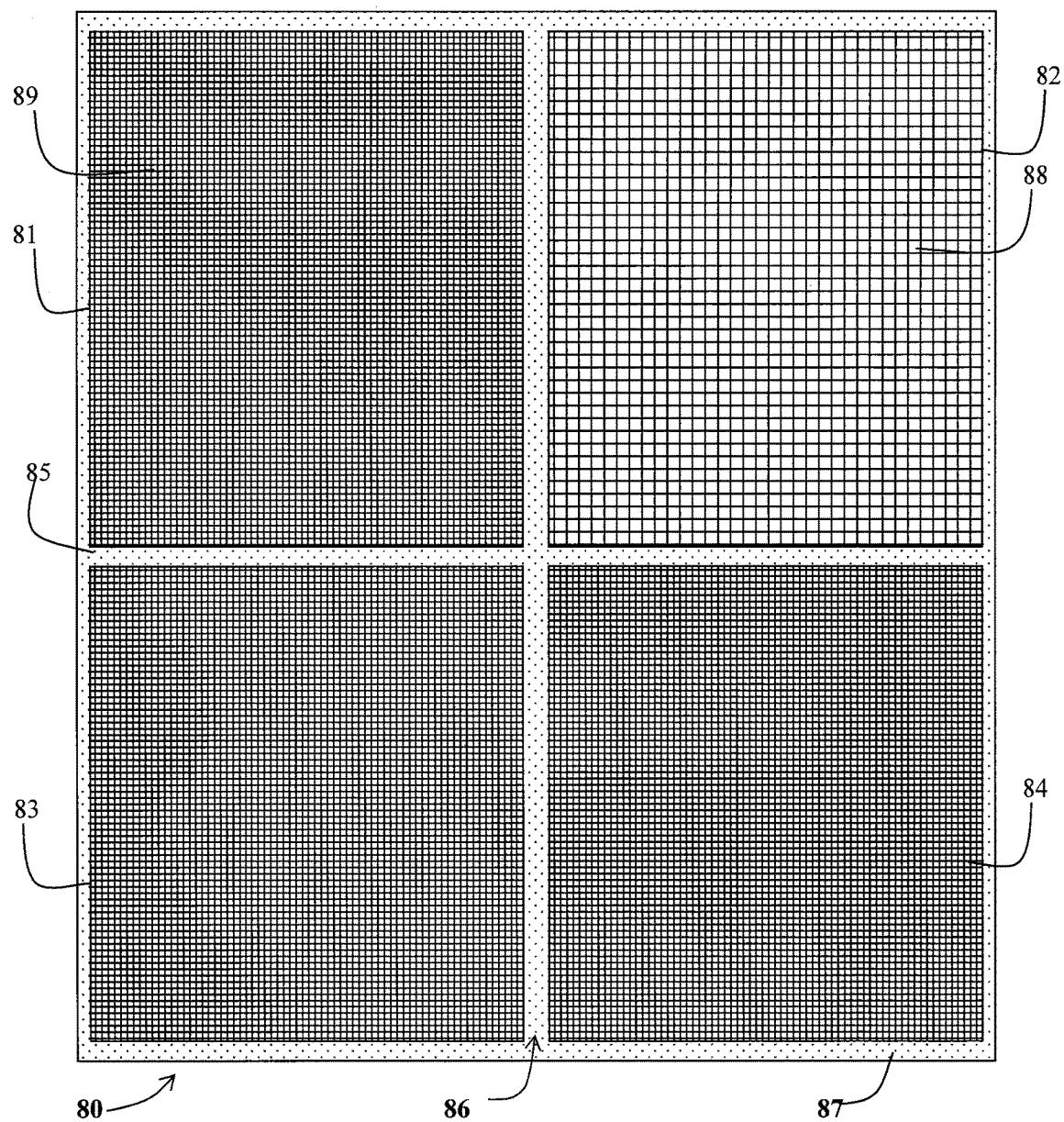
FIG. 5 is a schematic illustration of a panel used for fabricating embedded chips with surrounding through vias, showing how part of the panel, such as one panel may have sockets for a different type of die.

With reference to FIG. 5, the applicant, Zhuhai Access' panels 80 are typically divided into a 2×2 array of blocks 81, 82, 83, 84 separated from each other by a main frame consisting of a horizontal bar 85 a vertical bar 86 and an external frame 87. The blocks comprise array of chip sockets 12 FIG. 1) Assuming a 5 mm×5 mm chip size and Access' 21"×25" panels, this manufacturing technique enables 10,000 chips to be packaged on each panel. In contradistinction, fabricating chip packages on a 12" wafer, which is currently the largest wafer used in industry, enables only 2,500 chips to be processed in one go, so the economies of scale in fabricating on large panels will be appreciated.

Panels appropriate for this technology, may, however, vary in size somewhat. Typically, panels vary in size between about 12"×12" and about 24"×30". Some standard sizes in current use are 20"×16" and 25"×21".

Not all the blocks of the panel 80 need to have chip sockets 72 of the same size. For example, in the schematic illustration of FIG. 2, the chip sockets 88 of the top right block 82 are larger than the chip sockets 89 of the other blocks 81, 83, 84. Furthermore, not only may one or more blocks 82 be used for a different sized socket for receiving a different sized chip, but any sub array of any size may be used to fabricate any specific die package, so despite the large throughputs, small runs of small numbers of die packages may be fabricated, enabling different die packages to be simultaneously processed for a specific customer, or different packages to be fabricated for different customers. Thus a panel 80 may comprise at least one region 82 having sockets 88 with a first set of dimensions for receiving one type of chip, and a second region 81 having sockets 89 with a second set of dimensions for receiving a second type of chip or die.

Figure 6:
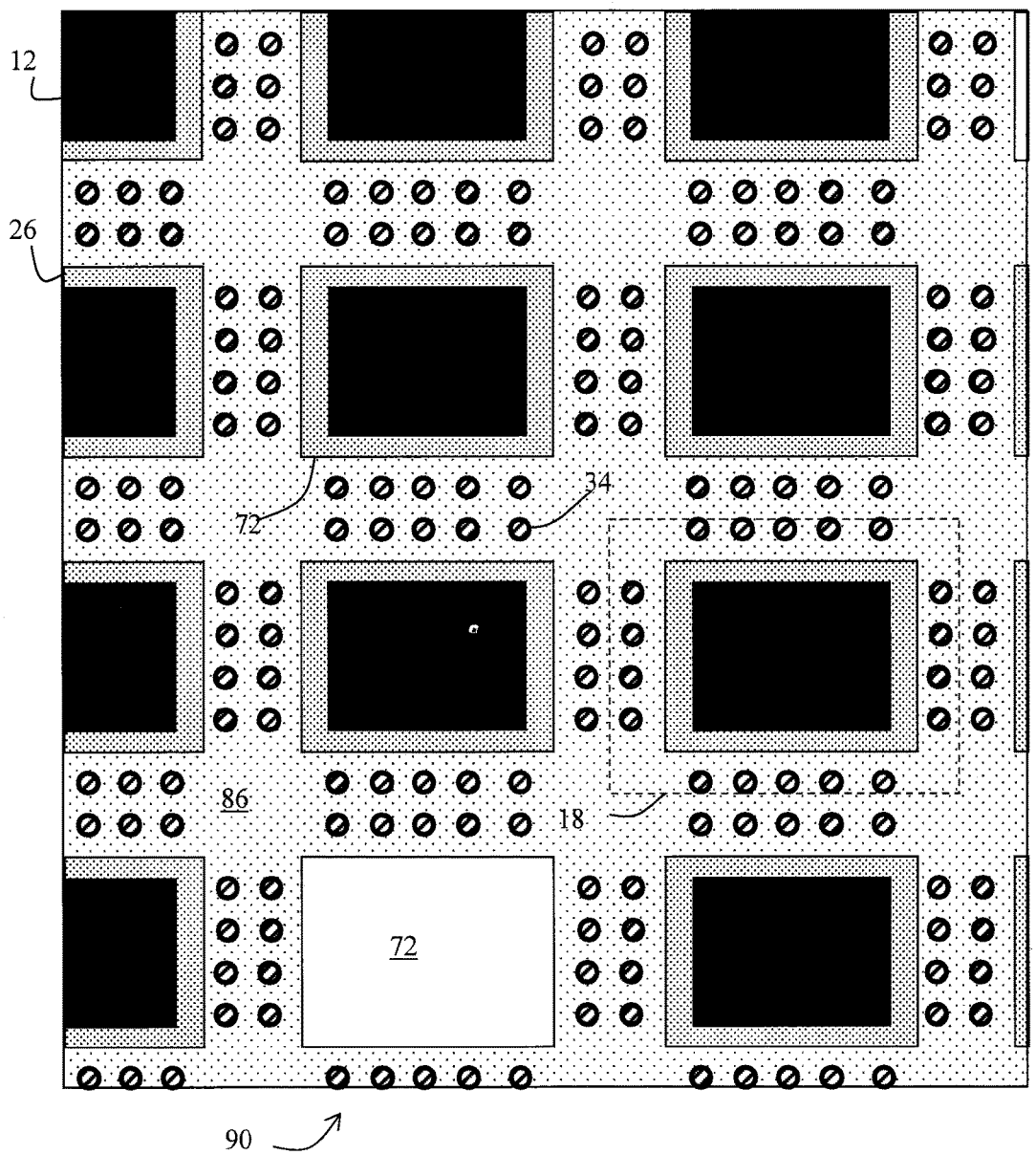
FIG. 6 is schematic illustration of the part of the polymer or composite framework of FIG. 4, with dies within each through socket, held in place by a polymer packaging material, such as a molding compound, for example, where the polymer packaging material surrounds the edges of the dies, filling in the space between die and frame, but does not cover the dies, the frame protruding beyond the consequently recessed dies and packaging material.

As described hereinabove with reference to FIG. 4, each chip socket 72 (88, 89 FIG. 5) is surrounded by a polymer frame 18 and in each block (81, 82, 83, 84—FIG. 6), an array of sockets 72 (88, 89) are positioned. With reference to FIG. 6, a chip 12 may be positioned in each socket 72, and the space around the chip 12 may be filled in with a packing material 26 which may or may not be the same polymer as that used for fabricating the framework 86, and each chip frame 18. The packaging material 26 may be a molding compound for example. In some embodiments, the matrix of the packing material 26 and that of the frame 18 may use similar polymers. In preferred embodiments, the polymer matrix of the frame 18 and that of the packaging material 26 comprise different polymer resins and the first polymer matrix of the frame 18 has a slower dry etch rate than the second polymer matrix of the packing material 26 under the same dry etching conditions.

The polymer matrix of the frame 18 may include continuous reinforcing fibers, whereas the polymer of the packing material 26 used for filling in the socket cannot include continuous fibers. However, the packing material 26 may include filler which may include chopped fibers and/or ceramic particles, for example.

Typical die sizes may be anything from about 1 mm×1 mm, up to about 60×60 mm, with the sockets slightly larger by 0.1 mm to 2.0 mm from each side of the die to accommodate the intended dies with clearance. The die thickness itself can range from 25 microns to 400 microns with typical values around 100 microns. The thickness of the frame must be at least the depth of the die, and is preferably up to 200 microns thicker.

As a result of the embedding of dies 12 into the sockets 72, each individual chip is surrounded by a frame 18 that may have vias 34 there-through, arranged around the edges of each die 12.

Unlike the chip packages described in pending patent publication no. US 2015/279,814 titled "embedded chips" wherein the polymer packaging material not only fills the gaps between the edges of the die 12 and the edges of the frame 18, but also covers the back of the die 12, in embodiments of the present invention; the polymer packaging material 26 covering the back of the die 12 is eroded away by dry plasma etching and copper feature layers are deposited directly onto the back 16 of the die.

Where provided, using Access' via post technology, either by pattern plating or by panel plating followed by selective etching, the vias 34 may be fabricated as via posts and subsequently laminated with a dielectric material, using polymer films, or, for added stability, pre-pregs consisting of woven glass fiber bundles in a polymer matrix. In one embodiment, the dielectric material is Hitachi 705G. In another embodiment, MGC 832 NXA NSFLCA is used. In a third embodiment, Sumitomo GT-K may be used.

Alternatively, the vias 34 may be fabricated using what is generally known as drill-fill technology where first a substrate is fabricated, and then, after curing, it is drilled with holes, either by mechanical or by laser drilling. The drilled holes may then be filled with copper by electroplating. In such cases, the substrate may be a laminate. It will generally comprise a polymer or a fiber reinforced polymer matrix.

There are many advantages in fabricating the vias 34 using via post rather than the drill-fill technology. In via post technology, since all vias may be fabricated simultaneously, whereas holes are drilled individually, the via post technology is faster. Furthermore, since drilled vias are cylindrical whereas via posts may have any shape. In practice all drill-fill vias have the same diameter (within tolerances), whereas via posts may have different shapes and sizes. Also, for enhanced stiffness, preferably the polymer matrix is fiber reinforced, typically with woven bundles of glass fibers. Where fiber in polymer pre-pregs are laid over upstanding via posts and cured, the posts are characterized by smooth, vertical sides. However, drill-fill vias typically taper somewhat and, where a composite is drilled; typically have rough surfaces which result in stray inductances that cause noise.

Generally, where provided, the vias 34 are in the range of 25 micron to 500 micron wide. If cylindrical, such as required for drill-fill and such as is often the case for via posts, each via may have a diameter in the range of 25 micron to 500 micron.

With further reference to FIG. 6, after fabricating the polymer matrix framework 86 (with or without embedded vias 34), the sockets 72 may be fabricated by CNC or punching. Alternatively, using either panel plating or pattern plating, sacrificial copper blocks may be deposited. If the copper via posts 34 are selectively shielded, using a photoresist, for example, such copper blocks may be etched away to create the sockets 72.

A polymer framework of a socket array 86, optionally with vias 34 in the frame 18 around each socket 72 may be used for creating individual and multiple chip packages, including multiple chip packages and built up multilayer chip packages.

Figure 7:
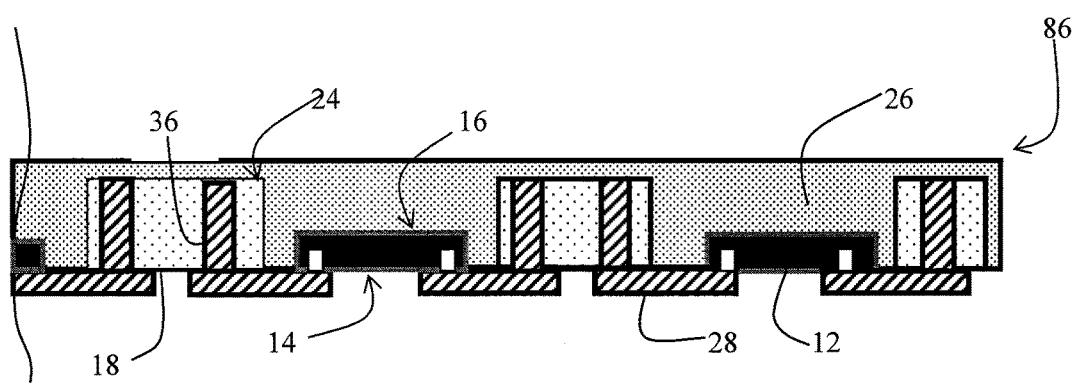
FIG. 7 is a schematic illustration of a cross-section through part of the framework showing embedded dies held within each through socket by a polymer packaging material that covers the dies and fills the frame.

With reference to FIG. 7, a section of the framework 86 is shown. The dies 12 may be positioned in the sockets 96 with the terminal face 14 of the die 12 being collinear with a face 20 of the framework 18. However, the framework 18 is taller (thicker) than the dies 12 and extends beyond the back face 16 of the die 12 (i.e. the face opposite the collinear front face 14). The dies 12 may be fixed in place using a packaging material 26 that is typically a polymer, such as a molding compound, a film B-stage polymer or a pre-preg. The packaging material 26 fills the spaces between the die 12 and the frame 18, covering the back face 16 of the dies 12 and may cover the opposite face 24 of the frame 18.

As shown in FIG. 7, however, by grinding. Polishing or chemical mechanical polishing, (CMP) the outer surface 24 of the frame 18 may be exposed. Then, the frame 18 may be protected with an etch shield, and the packaging material 26 over the back of the dies 12 is etched away, typically using a plasma etch, to expose the backs 16 of the dies 12. If the packaging material 26 is more susceptible to the etching conditions than the frame material 18, no etch shield is required.

Figure 8:
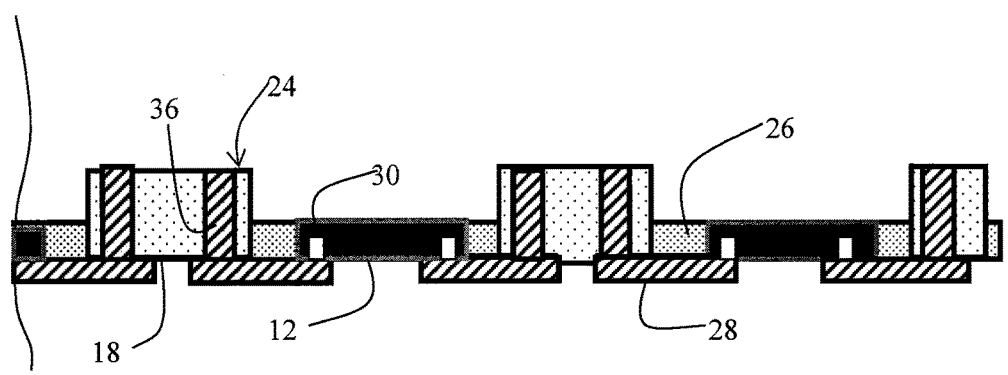
FIG. 8 is a schematic illustration of a cross-section through a die containing an embedded chip wherein a fan out arrangement couples the terminals of the embedded die to the through vias on a first surface, and the packaging material is removed from the back surface of the chip.

As shown in FIGS. 7 and 8, from the bottom, a feature layer of pads 28 may connect the terminals 30 of the die 12 in a fan out configuration over the surface of the frame 18, and be connected to vias 36 therethrough, if provided.

Figure 9:
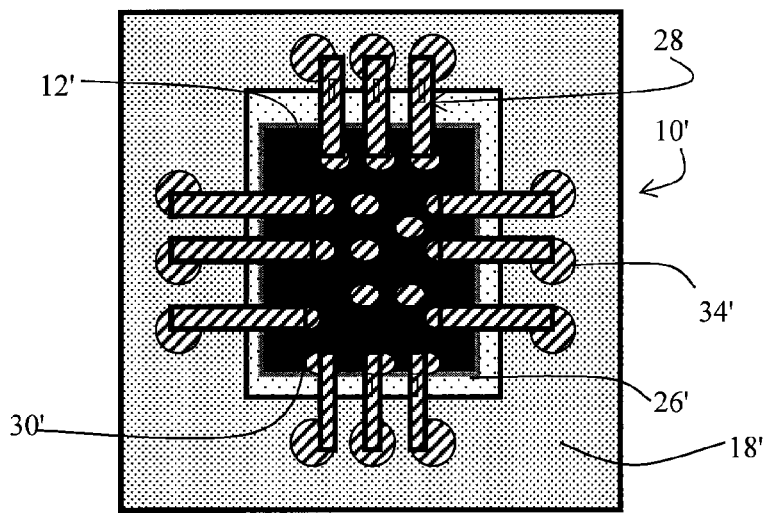
FIG. 9 is a schematic bottom view of a package such as that shown in FIG. 1.

With reference to FIG. 9, a die package 10' comprising a die 12' in a polymer frame 18' is shown from below, such that the die 12' is surrounded by the frame 18' and through vias 34' are provided through the frame 18' around the perimeter of the die 12'. The die is positioned in a socket and held in place by a packaging material 26' that is typically a different polymer from that of the frame 18'. The frame 18' is typically fabricated from a fiber reinforced pre-preg for stability. The second polymer of the packaging material 26' may be a polymer film or a molding compound. It may include fillers and may also include chopped fibers. Typically, as shown, the through vias 34' are simple cylindrical vias, but they may have different shapes and sizes. Some of the terminals 30' on the chip 12' are connected to the through vias 36' by pads 28' in a fan out configuration. As shown, there may be additional chip terminations 30' that are coupled directly to a substrate beneath the chip 12'. In some embodiments, for communication and data processing, at least one of the through vias is a coaxial via. Technologies for manufacturing coaxial vias are given in co-pending application U.S. Pat. No. 9,185,793, for example.

Figure 10:
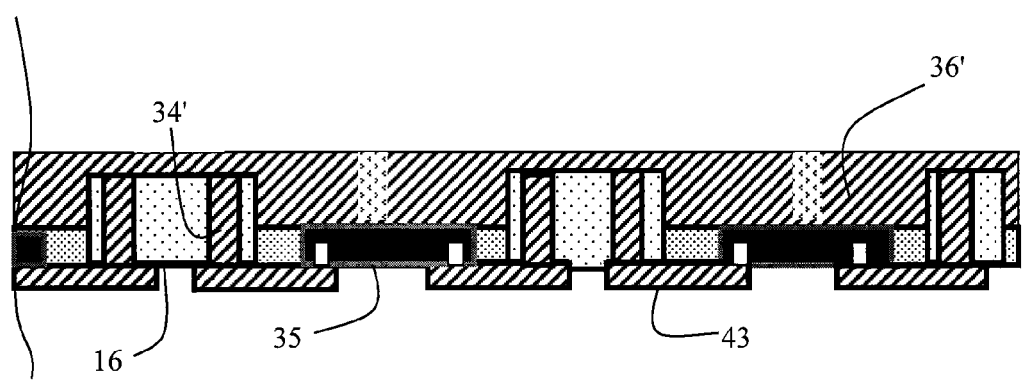
FIG. 10 is a side view of an array of packages with copper layers deposited over the dies to serve as heat sinks and fan in contacts.

With reference to FIG. 10, an additional copper routing layer 36' may be fabricated on the second face of the die 12 fanning in from the vias 34' through the framework 18 for example.

With reference to FIG. 2, a copper plate may be directly deposited onto and at least partially covering the second surface 16 of the die 12, acting as a heat sink for dissipating heat from the die 12.

The thick copper plate may be coupled by the through frame vias 34 or by a through silicon via in the chip itself.

As explained above, in some embodiments, adjacent chip sockets may have different dimensions, including different sizes and/or different shapes. Furthermore, a package may include more than one chip or die, and may include different chips. For example, a processor chip may be positioned in one socket and coupled to a memory chip positioned in an adjacent socket, the two dies being separated by a bar consisting of the frame material.

Conductors of the routing layer 28, 36 may couple to terminations of the through frame vias 34. At the current state of the art, via posts may be about 130 microns long. Where the chips 12 are thicker than about 130 microns, it may be necessary to stack one via post on top of another. The technology for stacking vias is known, and is discussed, inter alia, in co-pending applications U.S. Ser. Nos. 13/482, 099 and 13/483,185 to Hurwitz et al.

In addition to providing contacts for chip stacking, through vias 34 surrounding a chip 12 may be used to isolate the chip from its surroundings and to provide Faraday shielding. Such shielding vias may be coupled to pads that interconnect the shielding vias over the chip and provide shielding thereto.

There may be more than one row of through vias 34 surrounding the chip, and the inner row could be used for signaling and the outer row for shielding. The outer row of vias 34 could be coupled to a solid copper block fabricated over the chip or die 12 that could thereby serve as a heat sink to dissipate heat generated by the chip. Different dies may be packaged in this manner.

The embedded chip technology with a frame 18 having through vias 34 described herein is particularly suited for analog processing, since the contacts are short, and there are a relatively small number of contacts per chip.

It will be appreciated that the technology is not limited to packaging IC chips. In some embodiments, the die comprises a component selected from the group consisting of fuses, capacitors, inductors and filters. Technologies for manufacturing inductors and filters are described in co-pending application number U.S. Ser. No. 13/962,316 to Hurwitz et al.

Figure 11:
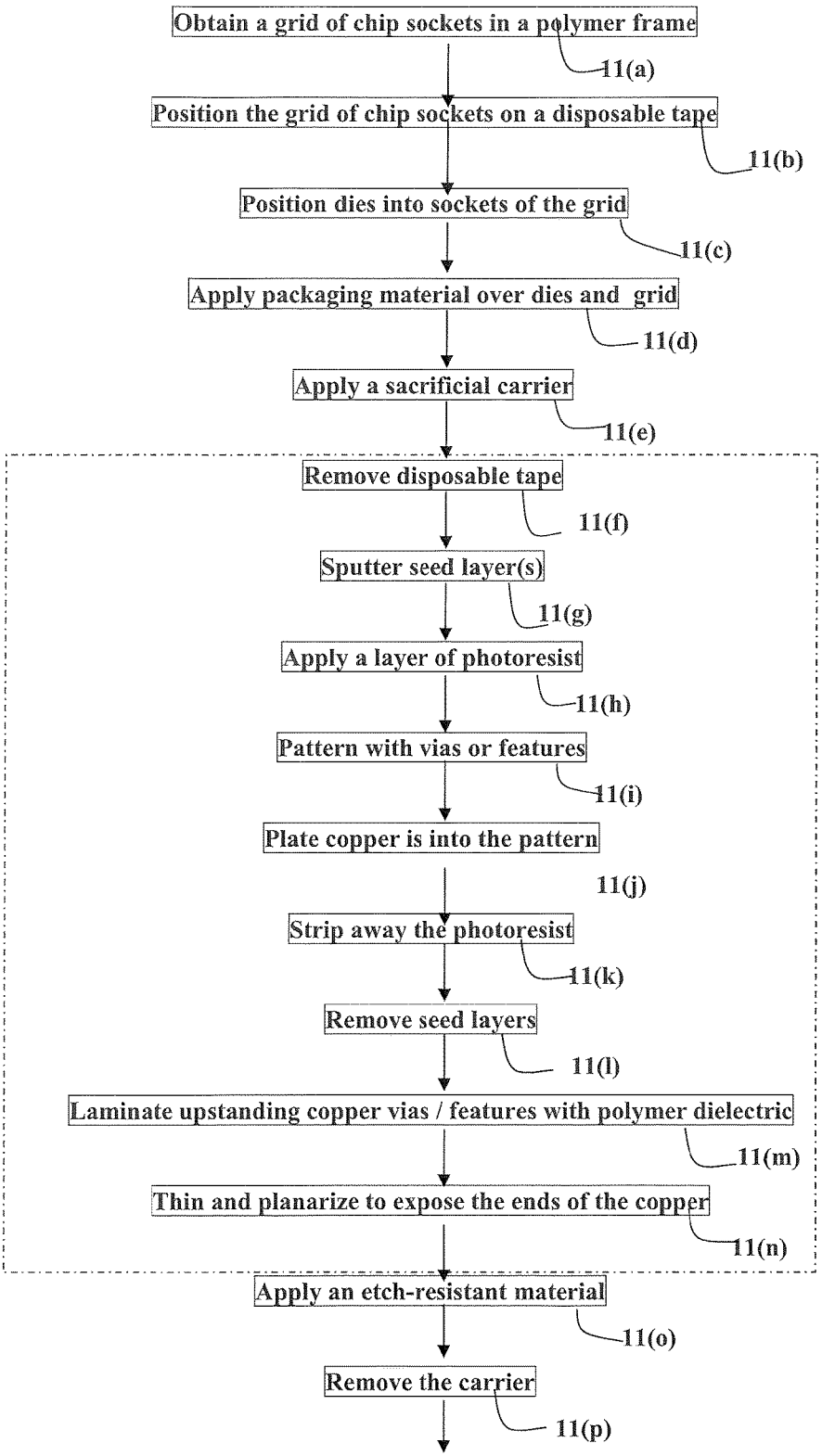
FIG. 11 is a flowchart showing how sockets may be fabricated in a panel, and how dies may be inserted into the sockets, coupled to the outside world and then sectioned into individual packages with embedded dies having copper routing layers on either or both faces.
Figure 11:
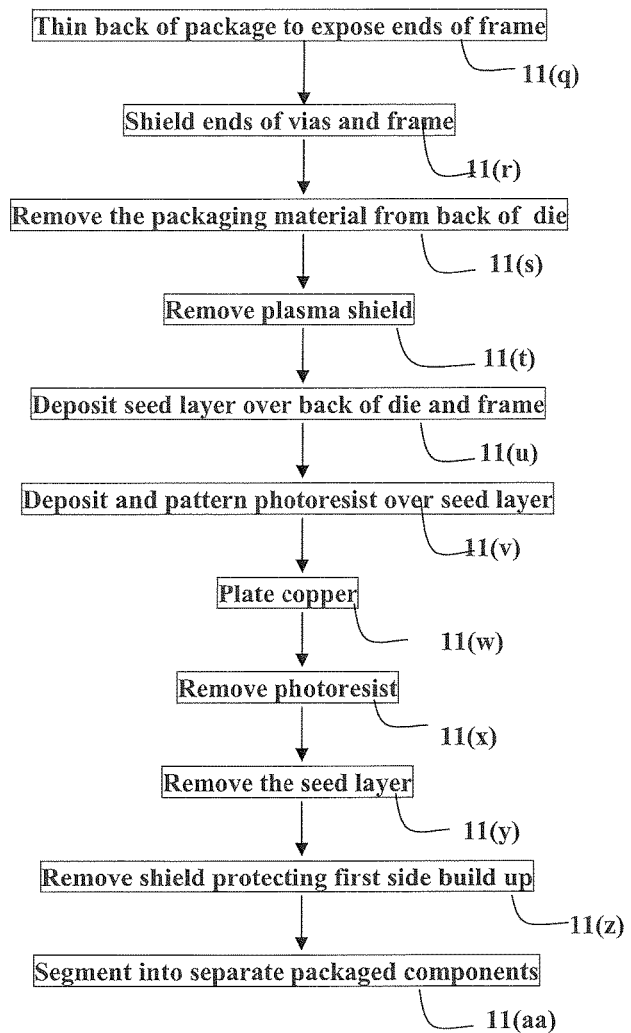
Figure 11A:
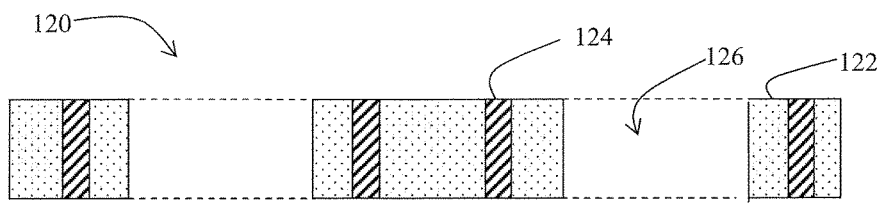
Figure 11B:
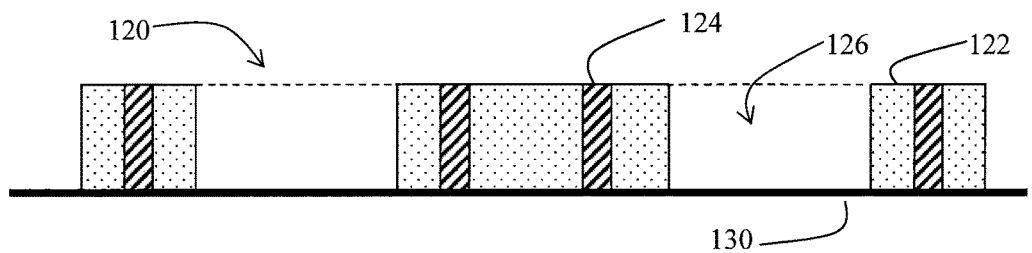
Figure 11C:
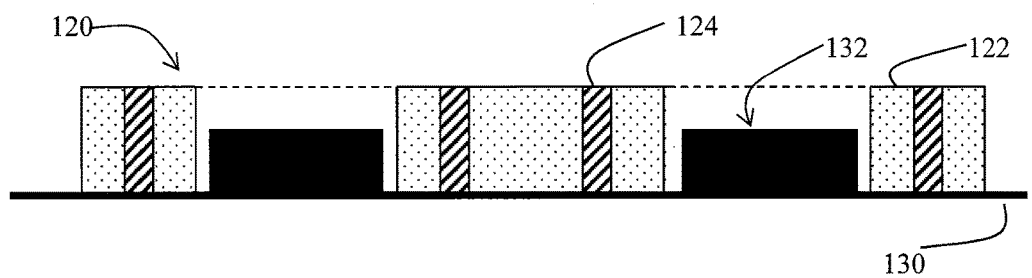
Figure 11D:
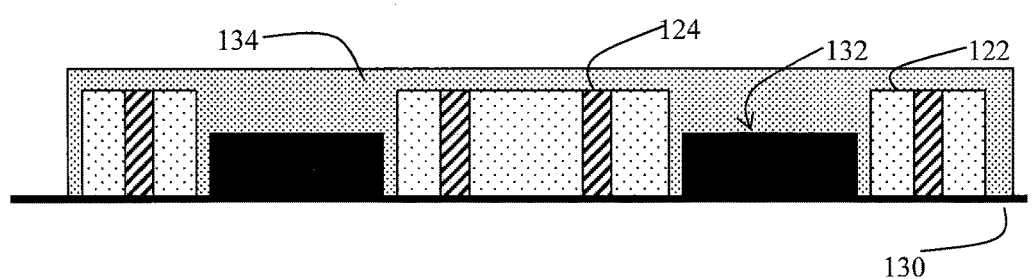

With reference to FIG. 11 and FIGS. 11(*a*) to 11(*aa*), a method of packaging chips in an organic frame such that feature layers may be deposited on both faces of the chips is now described.

FIG. 11(*aa*) is identical to FIG. 1. Thus a fabrication method for the structure of FIG. 1 is shown. It will be appreciated however, that this methodology may be adapted to fabricate other similar structures, such as those shown in FIGS. 2 and 3, for example.

With reference to FIG. 11(*a*) since the fabrication is generally performed in an array, a section of a framework 120 showing two sockets 126 is shown. The polymer frame 122 and vias 124 therein are shown.

The method includes obtaining or fabricating a grid 120 of chip sockets 126 each defined by an organic matrix frame 122 that optionally further comprises at least one via 124 through the organic matrix frame 122—12(*a*). See for example, FIG. 4.

As shown, the organic matrix frame 122 is a glass reinforced dielectric with embedded via posts 124, for example with the sockets punched out or machined out using CNC. Alternatively, the sockets 126 could be fabricated by electroplating blocks of copper into a pattern surrounded by a pattern or via posts, laminating to produce the frame 122 and then etching away the copper blocks whilst protecting the via posts. Alternatively, the sockets 126 could be punched out of a laminate having plated through holes. It will be noted that the sockets 126 are through sockets. More details of how such a grid of chip sockets 120 may be fabricated are given in pending patent publication No. US 2015/279,814, incorporated herein by reference.

The grid of chip sockets 120 is positioned on a disposable tape 130—step 11(*b*), FIG. 11(*b*). The tape 130 is generally a commercially available transparent film that may be decomposed by heating or by exposure to ultra-violet light.

Dies 132 are positioned face down (i.e. termination side down) in the sockets 126 of the grid 120—11(*c*), and may be aligned by imaging through the tape. The positioning of the dies 132 in the sockets 126 is typically fully automated. The height of the frame exceeds the thickness of the dies 132. As shown, the dies are processed with the terminal side in contact with the tape. However, as described hereinabove, the dies may alternatively be processed terminal side up.

A packaging material 134 is placed over the dies 132 and the grid 120—11(d). In one embodiment, the packaging material 134 is a dielectric film that is 180 microns thick and the dies 132 are 100 microns thick. However, dimensions may vary somewhat. The packaging material 134 typically has a thickness of from about 150 microns to several hundred microns. The packaging material 134 may be a molding compound. The dies 132 typically have a thickness of from 25 microns to hundreds of microns. It is important that the thickness of the packaging material 134 exceeds that of the die 132 by several tens of microns. In general, the frame 122 extends by up to 250 microns beyond the die 132. When applied, the packaging material 134 typically covers the frame 132.

Figure 11E:
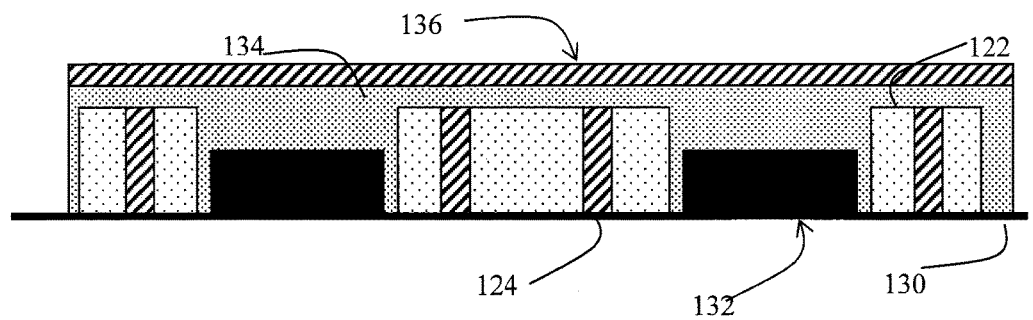
Figure 11F:
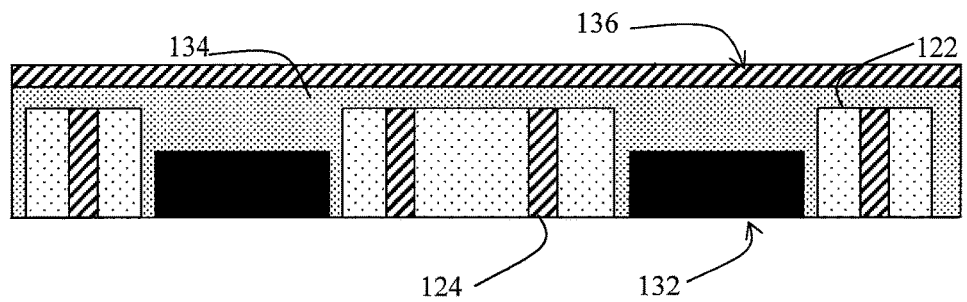
Figure 11G:
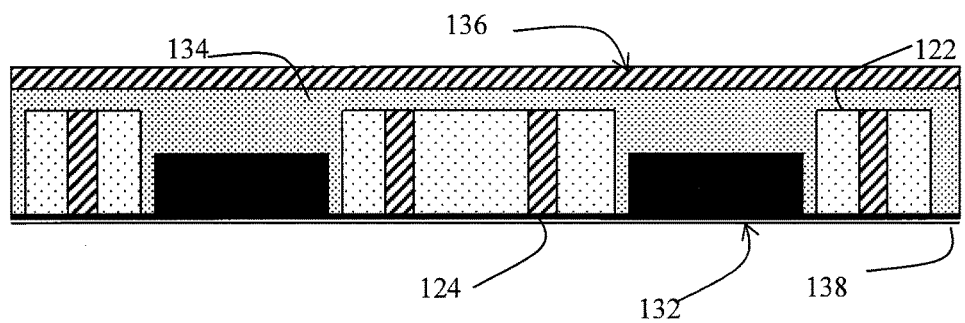
Figure 11H:
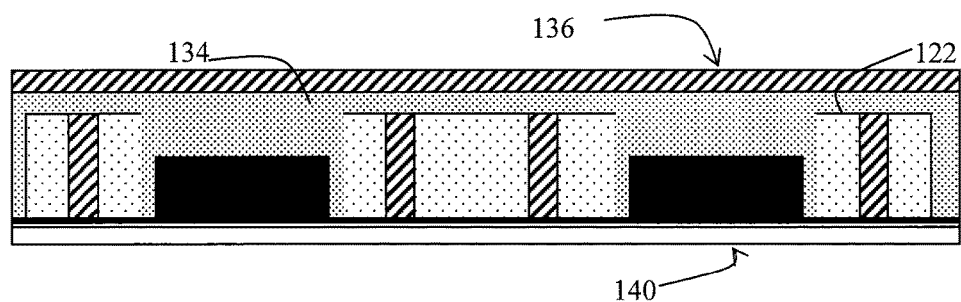
Figure 11I:
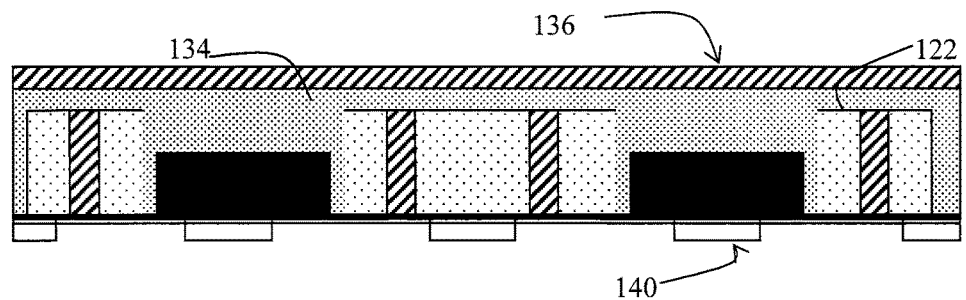
Figure 11J:
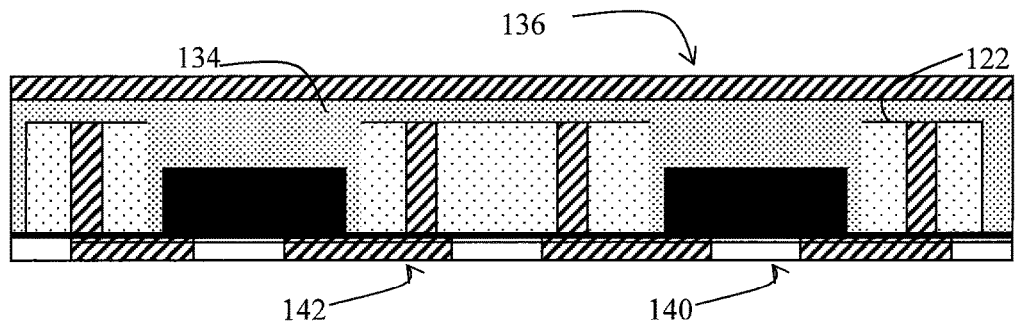
Figure 11K:
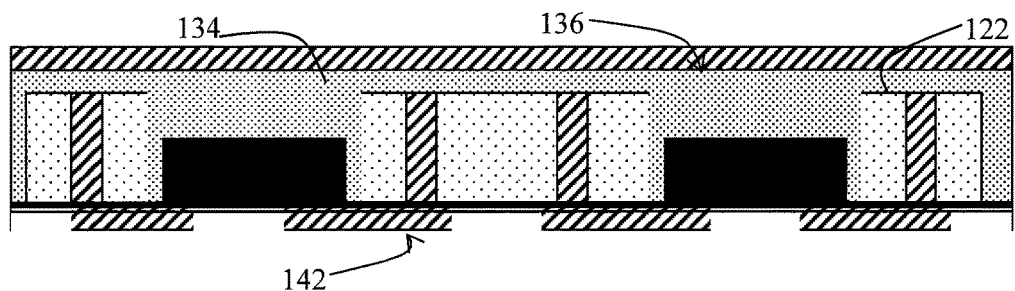
Figure 11L:
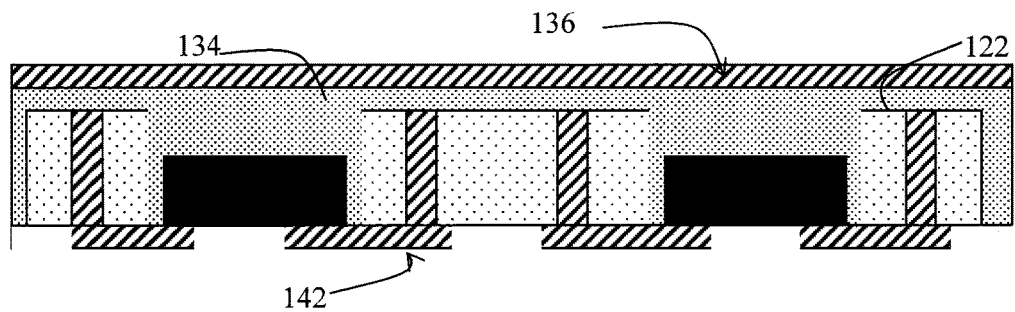
Figure 11M:
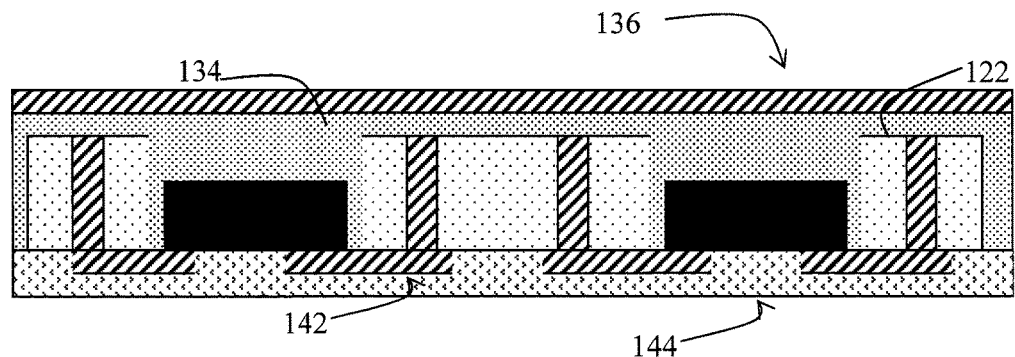
Figure 11N:
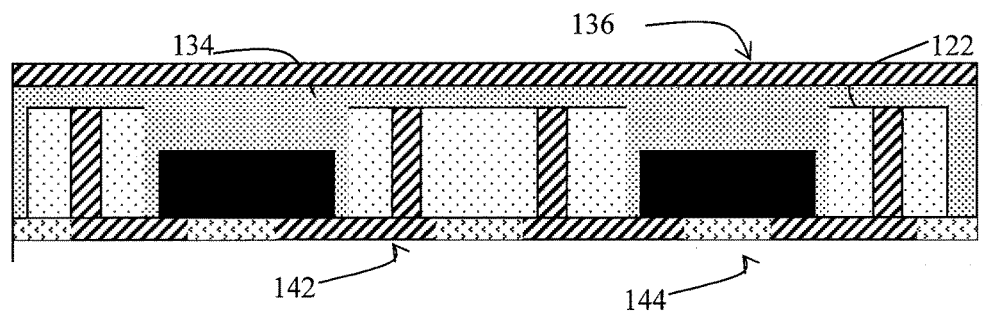
Figure 11O:
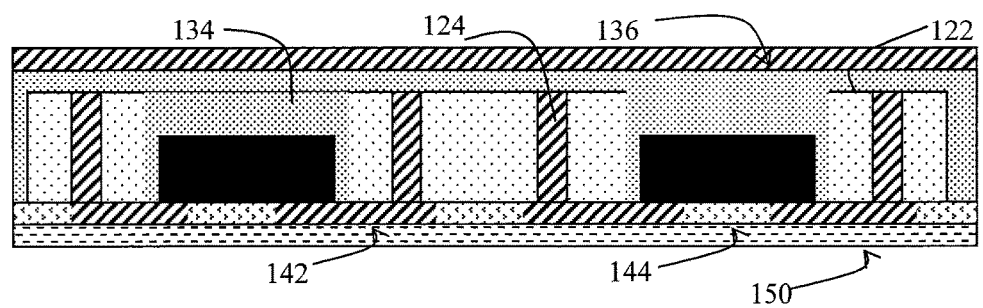
Figure 11P:
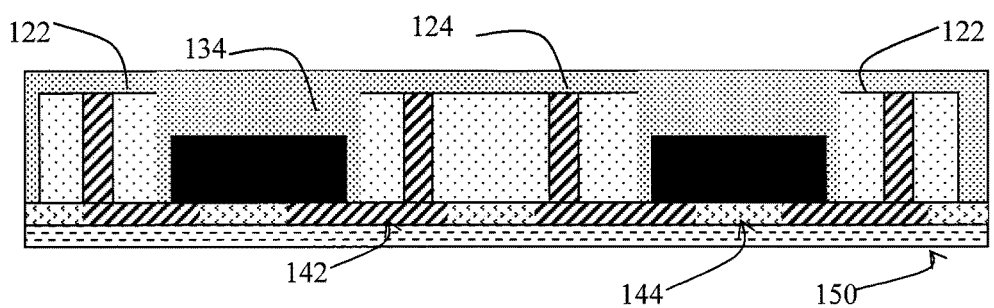
Figure 11Q:
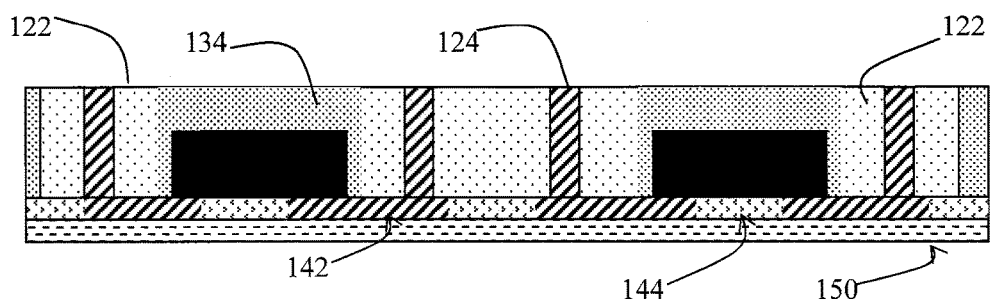

The dielectric material 122 of the frame 120 and the packaging material 134 applied over the dies 132 may have a similar matrix, or the polymer matrix may be very different. The frame 122 typically comprises continuous reinforcement fibers which may be provided as a pre-preg. The packaging material 134 does not include continuous fiber may include chopped fibers and/or particle fillers, At this stage, shown in FIG. 11(e), whilst the packaging material 134 covers and protects the backs of the dies 132 and outer ends of the vias 124, a carrier 136 may be applied over the packaging material 134—step 11(e), allowing the tape 130 to be removed—11(f), exposing the underside of the chips 132 (as shown, the connection side, but as described above, not necessarily) for further processing.

In one embodiment, the polymer of the packaging material 134 is ABF with ceramic particles and the polymer of the frame is 6785GTK pre-preg available from Sumitomo Bakelite.

Depending on the specific tape used, tape 130 may be burned away or removed—step 11(f) by exposure to ultraviolet light, or by mechanically peeling off A seed layer 138 (typically titanium and then copper) is sputtered over the exposed collinear first surfaces of the chip and frame—step 11(g). A layer of photo resist 140 is applied—step 11(h) and patterned—step 11(i). Copper 142 is electroplated into the pattern—step 11(j). The photo resist is stripped away—step 11(k) and the sputtered seed layer(s) 138 is (are) etched away—step 11(l). Then a polymer dielectric is laminated over the copper vias/features—step 11(m).

The structure is typically thinned and planarized. Often by chemical mechanical polishing CMP to expose the copper ends of the layer—step 11(n) before repeating, if desired, to deposit further layers.

By repeating steps 11(h) to 11(n) via layers may be deposited below the first metal layer (feature layer), and by repeating steps 11(g) to 11(n) further copper feature layers may be built up below the side of the die that is coplanar with the surface of the frame. If a feature layer is followed by a via layer, it is generally possible to apply photoresist over the exposed feature layer, to pattern with vias and electroplate the vias, and, after removal of the photoresist, to laminate the feature and via layer in one go (i.e. perform steps 11(h) to 11(k) twice to deposit a feature layer followed by a via layer.

Optionally, an etch barrier 144 such as a dry film or photo resist may be applied over the copper and underside of the chips—11(o). Alternatively, after lamination (step 11(m)) and before thinning (step 11(n), the copper carrier 136 may be etched away—step 11(p) using copper chloride or ammonium hydroxide, for example.

The construction is thinned to expose frame (and ends of vias if present)—step 11(q), optionally, using a plasma etch, such as $CF_4$ and $O_2$ in a ratio in the range of 1:1 to 3:1, for example. The plasma etch may be followed by or replaced with Chemical Mechanical Polishing (CMP).

Figure 11R:
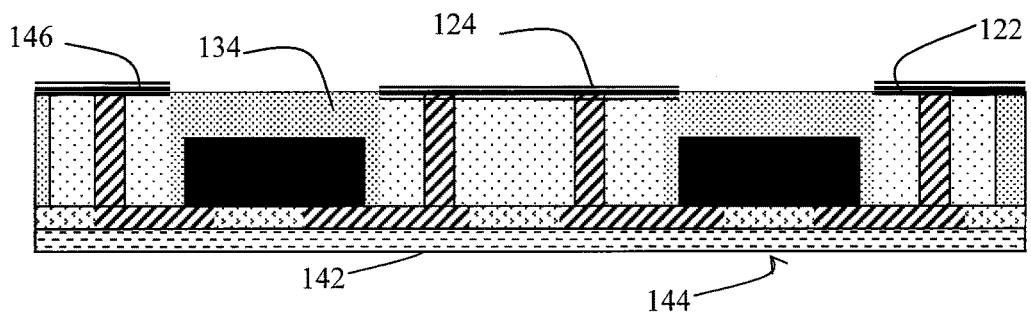
Figure 11S:
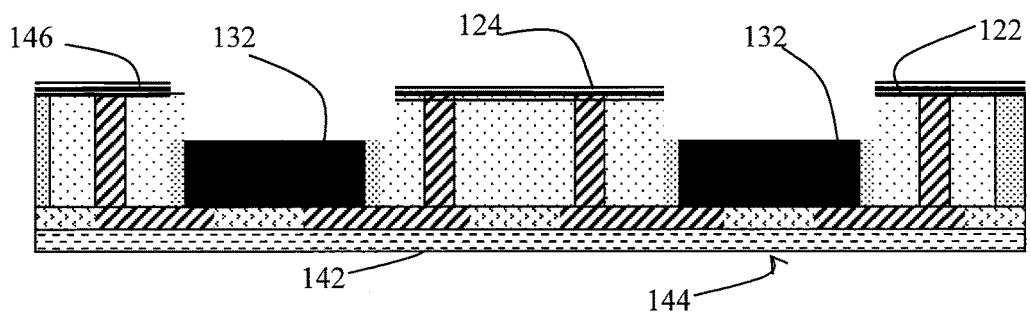
Figure 11T:
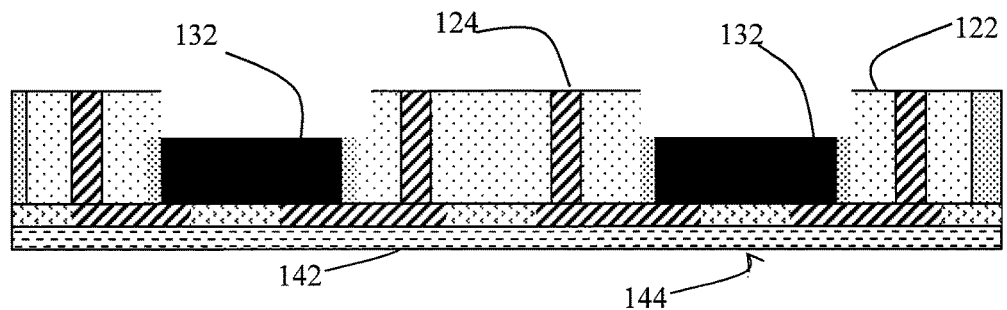
Figure 11U:
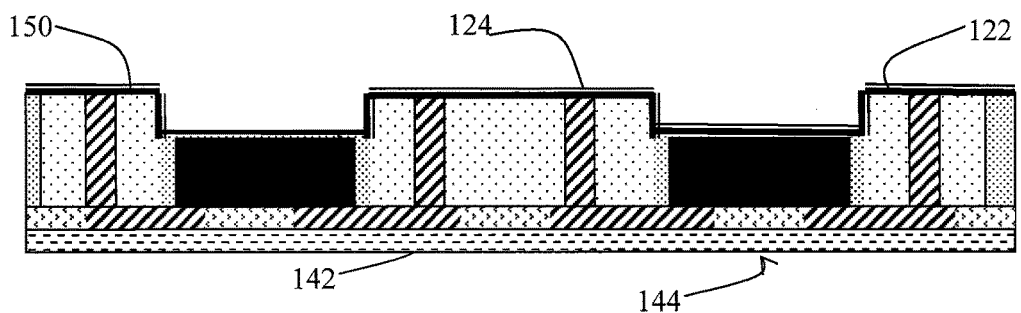
Figure 11V:
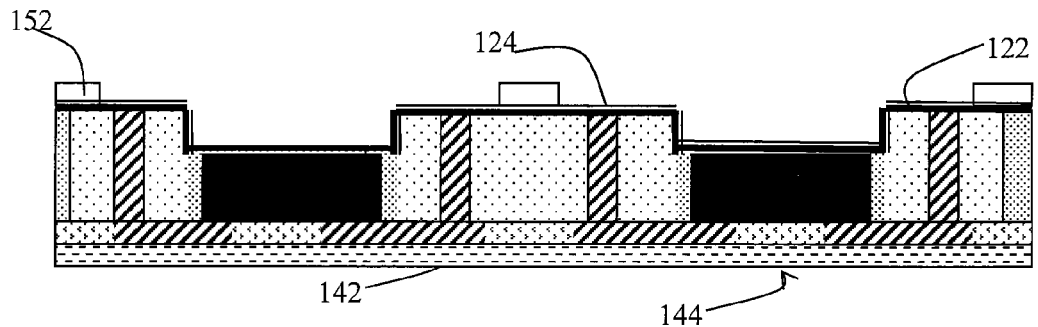
Figure 11W:
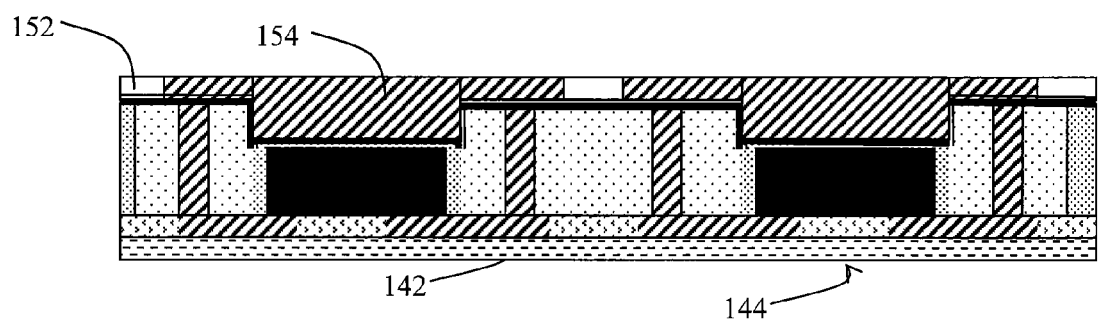
Figure 11X:
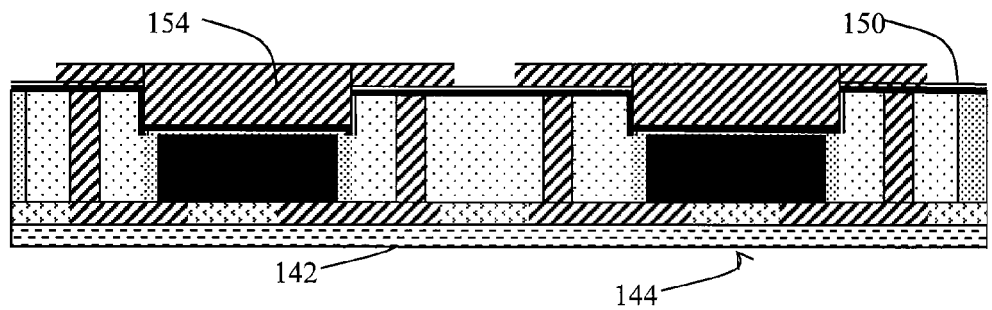
Figure 11Y:
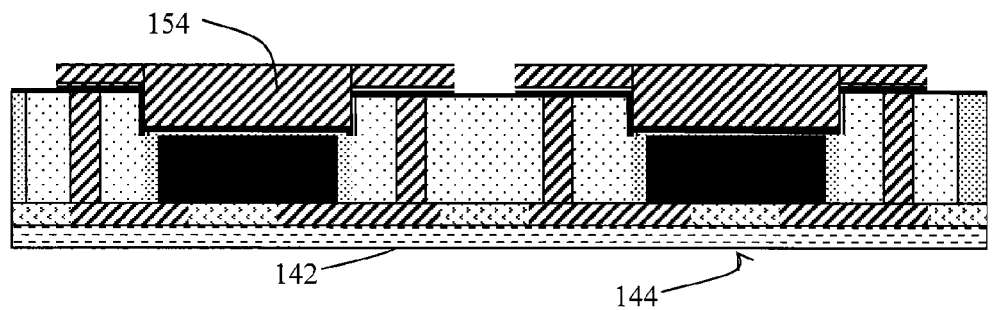
Figure 11Z:
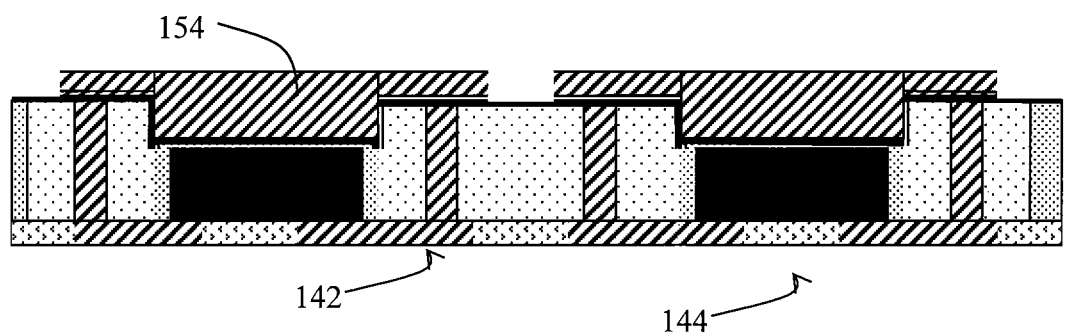
Figure 11:
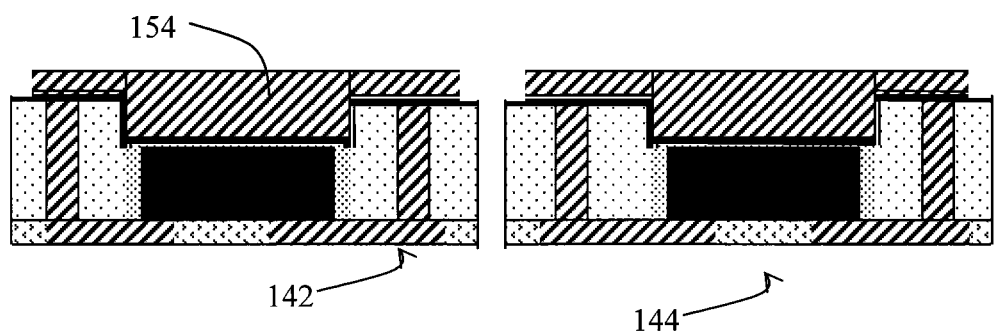

Now, the ends of the frame may be shielded with a plasma resistant shield 146—FIG. 11(r), and further plasma etching used to remove the polymer packaging material to the level of the back of the die—11(s).

The plasma shield 146 is then removed—step 11(t). If the packaging material selected is more susceptible to the plasma etching regime than the frame, no plasma shield is needed.

Steps 11(g) to 11(n) may now be repeated to deposit a feature layer which may be a fan in layer fanning in from the via ends over the back of the chip, or a heat sink layer on the back of the chip.

Thus a seed layer 150 may be deposited by sputtering—step 11(u). Photoresist 152 may be deposited and patterned—step 11(v) and a copper feature layer 154, such as an all over copper shield, for example may be deposited—step 11(w).

The photoresist 152 may then be removed—step 11(x) and then the seed layer etch protective layer 148 is then removed—step 11(y). Then the shielding layer 144 is removed from the other side of the array of chip packages—step 11(z).

It will be appreciated that if the shielding layer 144 is photoresist, step 11(z) may be accomplished together with step 11(x).

The layer build up is flexible and by repeating steps 11(v) to 11(x) additional via layers and features layers may be built up over the second feature layer 154.

The array is then segmented 11(aa). The segmenting or dicing may be accomplished using a rotary saw blade or other dicing technique, such as a laser, for example.

Several structures with feature layers or pads on both sides of an embedded chip are shown. Where vias are provided in a frame, these layers may be connected.

The die itself may include a through silicon via coupling the contact side to the back side thereof. Two-sided chips having circuitry on each side may also be terminated. Most importantly however, the chip package enables good heat dissipation as required by high performance chips and the packages have minimal numbers of layers and have feature layers and not via posts coupled to the chip itself. The packages are also typically flat on both sides.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed is:

1. An embedded chip-package for coupling a die to a PCB or device, the chip package comprising:
   a die having a terminal face and a back face separated by a die height;
   the die surrounded by a frame comprising a first polymer matrix;
   the frame having a frame height extending between a first frame face and a second frame face that is at least 3 micron meters thicker than the die height;

wherein the gap between the die and frame is filled with a packaging material comprising a second polymer matrix having a height equal to the die height;

wherein the die terminal face and the packaging material are coplanar with the first frame face;

the embedded chip package further comprising a first metal layer that is at least 1 micron thick and that is directly attached to the die, packaging material and first frame surface, and wherein a second metal layer is directly attached to the die back face, second frame face and packaging material and extends as a layer that is at least 1 micron thick over the frame surface and at least 4 micron meters thick over the die and packaging material surfaces, and wherein an outer surface of the second metal layer is flat, the second metal layer comprising an at least two electrically separate nets, each net comprising elements having two ends, a first end on the die area and a second end on the frame area in a fan-out configuration or with a second end on the die area in a fan out configuration.

2. The embedded chip package of claim 1 wherein the outer surface of the first metal layer is flat and serves as a re-distribution layer comprising elements having one end on a die terminal and a second end on the frame face area in a fan-out or fan in configuration.

3. The embedded chip package of claim 1 wherein an outer surface of the second metal layer is flat and at least a portion of the second metal layer attached to and over the die serves as a heat-sink to aid heat dissipation from the backface of the die.

4. The embedded chip package of claim 2 wherein the second end of the element in the redistribution layer is selected from the group comprising BGA pads, LGA pads, wire-bond pads, flip-chip pads and is used to attach the embedded chip package to a PCB or a device.

5. The embedded chip package of claim 1 wherein at least one of the ends of the elements in the second layer is a BGA pad, LGA pad, wire-bond pad or flip-chip pad for attaching the embedded chip package to a PCB or a device.

6. The embedded chip package of claim 1 wherein the first metal layer is less than 50 microns thick and the second metal layer is less than 200 microns thick.

7. The embedded chip package of claim 1 wherein the height of said frame is up to 500 microns meters thick and is up to 50 micron meters thicker than the thickness of the die.

8. The embedded chip package of claim 1 wherein the first polymer matrix and the second polymer matrix comprise different polymers.

9. The embedded chip package of claim 1 wherein the first polymer matrix has a slower dry etch rate than the second polymer matrix under same dry etching conditions.

10. The embedded chip package of claim 1 wherein the frame further comprises at least one of ceramic particulate fillers and woven glass fibers.

11. The embedded chip package of claim 1 wherein the frame further comprises at least one metal via extending the height of the frame from the first frame face to the second frame face of the frame.

12. The embedded chip package of claim 1 wherein the packaging material further comprises at least one of ceramic particulate fillers and chopped glass fibers.

13. The embedded chip package of claim 1 wherein said die terminal face contains metal terminal contacts surrounded by a dielectric passivation layer where said metal terminal contacts and said dielectric passivation layer are coplanar with the first frame face and a face of the intervening packaging material.

14. The embedded chip package of claim 13 where said metal terminal contacts comprise a metal selected from the group comprising Al, Cu, Au, W and the passivation layer is selected from the group comprising polyimides and silicon nitride.

15. The embedded chip package of claim 11 where the first metal layer is connected to a surface of at least one via on said first frame face, said via running through the frame to the second frame face.

16. The embedded chip package of claim 1 wherein at least some of the metal layer attached directly to the die back surface functions as a metal interconnect feature layer in a fan out configuration that couples the die back surface to the frame face.

17. The embedded chip package of claim 11 wherein the at least one metal feature layer is coupled to at least one via running through the frame from the second frame face to the first frame face.

18. The embedded chip package of claim 1 wherein the die comprises at least one metal pad on its back face and further comprises at least one Through Silicon Via (TSV) electrically connecting the metal pad to at least one contact on the terminal face.

19. The embedded chip package of claim 11 where said metal via comprises copper.

20. The embedded chip package of claim 1 wherein the first and second metal layer comprise copper.

21. The embedded chip package of claim 20 wherein said first and second metal layer further comprise adhesion/barrier metal layers sandwiched between the copper and the die frame and packaging material surfaces, the adhesion/barrier layer selected from the group comprising Ti, Ta, Cr, Ti/Ta and Ti/W.

22. The embedded chip package of claim 1 wherein the die comprises at least one component selected from the group comprising analog integrated circuits, digital integrated circuits, filters, switches, flash memories, MEMS chips, sensors and Integrated Passive Devices.

23. The embedded chip package of claim 1 comprising a plurality of dies within the same frame, the dies separated by the polymer packaging material.

24. The embedded chip package of claim 1 comprising a plurality of dies separated by the polymer packaging material and by a bar of the frame.

25. The embedded chip package of claim 2 further comprising additional redistribution layers parallel to the first metal layer on an opposite side thereof from the die, and separated therefrom by a polymer dielectric material and interconnected therewith by vias.

26. The embedded chip package of claim 25 wherein a second end of an element in an outermost redistribution layer is selected from the group comprising BGA pads, LGA pads, wire-bond pads and flip-chip pads and is used to attach the embedded chip package to a PCB or a device.

27. The embedded chip package of claim 1 further comprising at least one further metal layer parallel to the die back surface and beyond the second metal layer, and separated from said second metal layer by a polymer dielectric material but interconnected to said second metal layer by at least one metallic via through the polymer dielectric material.

28. The embedded chip package of claim 27 where one end of an element in the external layer is selected from the group comprising a BGA pad, LGA pad, wire-bond pad, and flip-chip pad and is used to attach the embedded chip package to a PCB or a device.

29. The embedded chip package of claim 4 where said device is a die, IC package, inductor, resistor, capacitor or integrated passive device.

30. The embedded chip package of claim 5 where said device is a die, IC package, inductor, resistor, capacitor or integrated passive device.

31. The embedded chip package of claim 26 where said device is a die, IC package, inductor, resistor, capacitor or integrated passive device.

32. The embedded chip package of claim 27 where said device is a die, IC package, inductor, resistor, capacitor or integrated passive device.

33. An embedded chip-package for coupling a die to a PCB or device, the chip package comprising:
   a die having a terminal face and a back face separated by a die height;
   the die surrounded by a frame comprising a first polymer matrix;
   the frame having a frame height extending between a first frame face and a second frame face that is at least 3 micron meters thicker than the die height;
   wherein the gap between the die and frame is filled with a packaging material comprising a second polymer matrix having a height -equal to the die height;
   wherein the die terminal face and the packaging material are coplanar with the first frame face;
   the embedded chip package further comprising a first metal layer that is at least 1 micron thick and that is directly attached to the die, packaging material and first frame surface, and wherein a second metal layer is directly attached to the die back face, second frame face and packaging material and extends as a layer that is at least 1 micron thick over the frame surface and at least 4 micron meters thick over the die and packaging material surfaces, wherein an outer surface of the second metal layer is flat and at least a portion of the second metal layer attached to and over the die serves as a heat-sink to aid heat dissipation from the back-face of the die, and further comprising at least one further metal layer parallel to the die back surface and beyond the second metal layer, and separated from said second metal layer by a polymer dielectric material but interconnected to said second metal layer by at least one metallic via through the polymer dielectric material.

34. The embedded chip package of claim 33 where one end of an element in the external layer is selected from the group comprising a BGA pad, LGA pad, wire-bond pad, and flip-chip pad and is used to attach the embedded chip package to a PCB or a device.

* * * * *